United States Patent
Jang et al.

(10) Patent No.: US 7,442,588 B2
(45) Date of Patent: Oct. 28, 2008

(54) METHOD FOR FABRICATING THIN FILM TRANSISTOR USING LOCAL OXIDATION AND TRANSPARENT THIN FILM TRANSISTOR

(75) Inventors: Jin Jang, Seoul (KR); Se-Hwan Kim, Seoul (KR); Youn-Duck Nam, Seoul (KR); Eung-Bum Kim, Busan (KR); Ji-Ho Hur, Seoul (KR)

(73) Assignee: Silicon Display Technology Co., Ltd., Seoul (KR)

( * ) Notice: Subject to any disclaimer, the term of this patent is extended or adjusted under 35 U.S.C. 154(b) by 0 days.

(21) Appl. No.: 11/830,010

(22) Filed: Jul. 30, 2007

(65) Prior Publication Data

US 2008/0206935 A1    Aug. 28, 2008

(30) Foreign Application Priority Data

Feb. 23, 2007    (KR) ..................... 10-2007-0018274

(51) Int. Cl.
 *H01L 21/00* (2006.01)
(52) U.S. Cl. ............................. 438/149; 257/E21.414
(58) Field of Classification Search ................ 438/142, 438/149, 159, 478; 257/59, 66, 72, E21.414, 257/E21.166, E29.294
See application file for complete search history.

(56) References Cited

U.S. PATENT DOCUMENTS 5,047,360 A * 9/1991 Nicholas ..................... 438/158

FOREIGN PATENT DOCUMENTS

JP    2001-036095    2/2001

* cited by examiner

*Primary Examiner*—David Vu
(74) *Attorney, Agent, or Firm*—Ked & Associates, LLP

(57) ABSTRACT

Disclosed is a method for fabricating a thin film transistor. Specifically, the method uses local oxidation wherein a portion of a transparent metal oxide layer is locally oxidized to be converted into a semiconductor layer so that the oxidized portion of the transparent metal oxide layer can be used as a channel region and the unoxidized portions of the transparent metal oxide layer can be used as source and drain electrodes.

The method comprises the steps of forming a gate electrode on a substrate and forming a gate insulating layer thereon, forming a transparent metal oxide layer on the gate insulating layer, forming an oxidation barrier layer on the transparent metal oxide layer in such a manner that a portion of the transparent metal oxide layer positioned over the gate electrode is exposed, and locally oxidizing only the exposed portion of the transparent metal oxide layer to convert the exposed portion into a semiconductor layer.

7 Claims, 2 Drawing Sheets

METHOD FOR FABRICATING THIN FILM TRANSISTOR USING LOCAL OXIDATION AND TRANSPARENT THIN FILM TRANSISTOR

BACKGROUND OF THE INVENTION

1. Field of the Invention

The present invention relates to a method for fabricating a thin film transistor and a transparent thin film transistor. More particularly, the present invention relates to a method for fabricating a thin film transistor using local oxidation wherein a portion of a transparent metal oxide layer is locally oxidized to be converted into a semiconductor layer so that the oxidized portion of the transparent metal oxide layer can be used as a channel region and the unoxidized portions of the transparent metal oxide layer can be used as source and drain electrodes, as well as a transparent thin film transistor.

2. Description of the Related Art

Thin film transistors are generally fabricated by forming a gate electrode on a substrate, forming a gate insulating layer thereon, and forming a channel region and source/drain electrodes on the gate insulating layer.

The steps of forming the channel region using a semiconductor and forming the source/drain electrodes using an electrically conductive material are separately carried out and require an increased number of processes in the fabrication method. For example, the formation of the channel region and the source/drain electrodes involve a number of processes, e.g., deposition and patterning through a mask, which disadvantageously incur increased fabrication costs and make the fabrication procedure complicated.

SUMMARY OF THE INVENTION

The present invention has been made in view of the problems of the prior art, and it is an object of the present invention to provide a method for fabricating a thin film transistor using local oxidation wherein a portion of a transparent metal oxide layer is locally oxidized to be converted into a semiconductor layer so that the oxidized portion of the transparent metal oxide layer can be used as a channel region and the unoxidized portions of the transparent metal oxide layer can be used as source and drain electrodes, as well as a transparent thin film transistor.

In accordance with one aspect of the present invention for achieving the above object, there is provided a method for fabricating a thin film transistor, the method comprising the steps of forming a gate electrode on a substrate and forming a gate insulating layer thereon, forming a transparent metal oxide layer on the gate insulating layer, forming an oxidation barrier layer on the transparent metal oxide layer in such a manner that a portion of the transparent metal oxide layer positioned over the gate electrode is exposed, and locally oxidizing only the exposed portion of the transparent metal oxide layer to convert the exposed portion into a semiconductor layer.

The transparent metal oxide layer is preferably a metal-rich conductive oxide layer. Accordingly, the transparent metal oxide layer can be used to form source and drain electrodes.

The local oxidation is preferably performed by a technique selected from ion implantation, chemical oxidation, and anodization. The selected technique allows the exposed portion of the transparent metal oxide layer to have semiconducting properties, so that the exposed portion can be used as a channel region of a final thin film transistor.

The transparent metal oxide layer preferably has a thickness of 1 nm to 1,000 nm.

The open portion of the oxidation barrier layer preferably has the same length as a channel of a final thin film transistor.

The oxidation barrier layer preferably has a pattern size larger than the width of the transparent metal oxide layer.

In accordance with another aspect of the present invention, there is provided a transparent thin film transistor fabricated by the method.

BRIEF DESCRIPTION OF THE DRAWINGS

The above and other objects, features and other advantages of the present invention will be more clearly understood from the following detailed description taken in conjunction with the accompanying drawings, in which.

DETAILED DESCRIPTION OF THE PREFERRED EMBODIMENTS

Preferred embodiments of a method for fabricating a thin film transistor using local oxidation and a transparent thin film transistor according to the present invention will now be described in detail with reference to the accompanying drawings.

Figure 4:
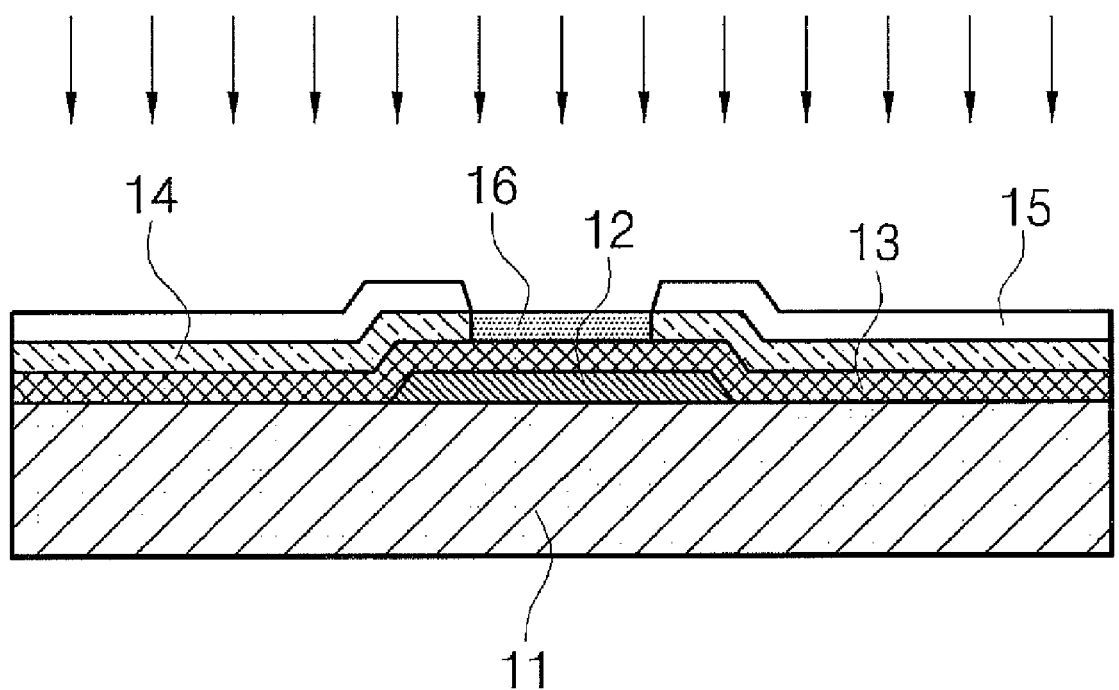

FIG. 4 is a partial cross-sectional view of a transparent thin film transistor fabricated by a method for fabricating a thin film transistor using local oxidation according to the present invention.

As shown in FIG. 4, the transparent thin film transistor comprises a substrate 11, a gate electrode 12 formed on the substrate 11, a gate insulating layer 13 formed on the substrate 11 and the gate electrode 12, source/drain electrodes 14 formed on the gate insulating layer 13, and a semiconductor channel region 16 formed on the gate insulating layer 13 wherein the source/drain electrodes 14 are made of a transparent metal oxide layer formed by deposition and the semiconductor channel region 16 is formed over the gate electrode 12.

It should, of course, be understood that the transparent thin film transistor may further comprise at least one element formed on the semiconductor channel region 16 and the source/drain electrodes 14. The additional element is a constituent of a general thin film transistor, and for example, may be selected from a passivation layer and a pixel electrode.

The source/drain electrodes 14 of the transparent thin film transistor are made of a transparent metal oxide layer formed on the gate insulating layer 13. The transparent metal oxide layer is a metal-rich conductive oxide layer and can be directly used as the source/drain electrodes 14.

According to the prior art method, source/drain electrodes are formed by depositing a particular metallic material and patterning the metallic material through a mask. In contrast, the source/drain electrodes 14 used in the present invention can be directly formed using portions of the transparent metal oxide layer deposited on the gate insulating layer 13.

The semiconductor channel region 16 is formed by locally oxidizing a portion of the transparent metal oxide layer formed on the gate insulating layer 13 to convert the oxidized portion into a semiconductor layer. That is, only a portion of the transparent metal oxide layer is locally oxidized by a suitable technique, such as ion implantation, to be converted into a semiconductor layer suitable for use as the channel region.

An explanation of a method for fabricating the transparent thin film transistor will be provided below.

Figure 1:
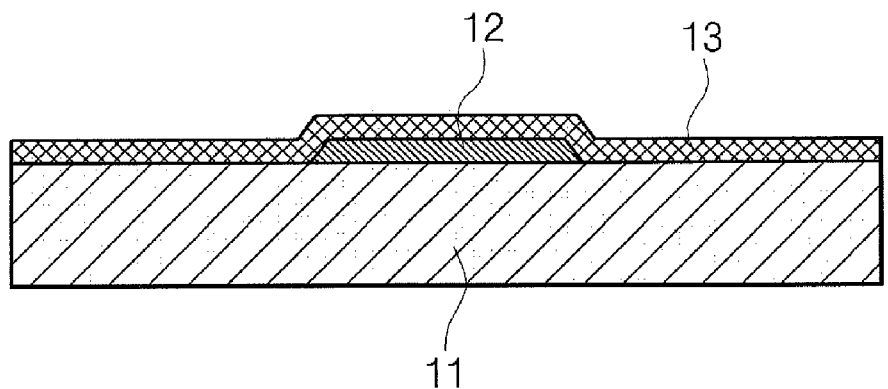
FIGS. 1 through 4 illustrate steps of a method for fabricating a thin film transistor using local oxidation according to the present invention.

First, a gate electrode 12 is formed on a substrate 11, as shown in FIG. 1. A gate insulating layer 13 is formed on the substrate 11 and the gate electrode 12. The gate electrode 12 is formed by depositing a gate electrode material on the substrate 11 and patterning the material through a mask. The gate insulating layer 13 is formed on the gate electrode 12 and the substrate 11 by any appropriate deposition technique.

Figure 2:
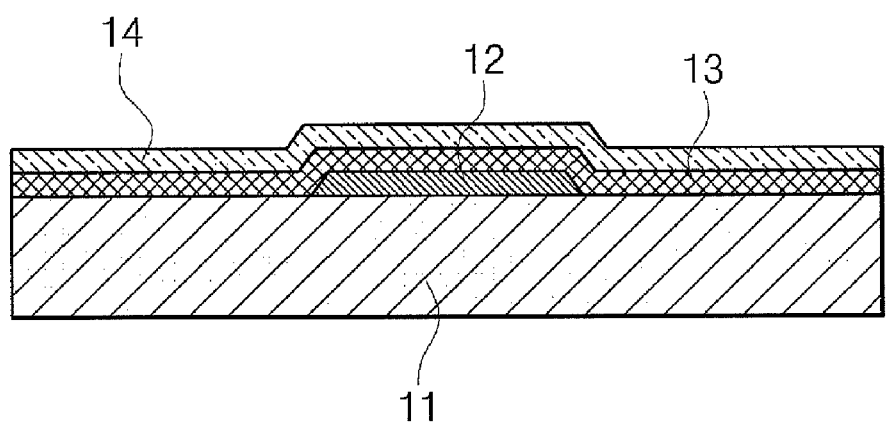

Then, as shown in FIG. 2, a transparent metal oxide layer 14 is formed on the gate insulating layer 13. As will be described below, portions of the transparent metal oxide layer 14 are used to form source/drain electrodes, and the remaining portion is locally oxidized to be used as a semiconductor channel region.

The transparent metal oxide layer 14 is a metal-rich conductive oxide layer. That is, so long as portions of the transparent metal oxide layer are not oxidized to be converted into semiconductor layers, they can be used to form source and drain electrodes. The transparent metal oxide layer preferably has a thickness between 1 nm and 1,000 nm.

Figure 3:
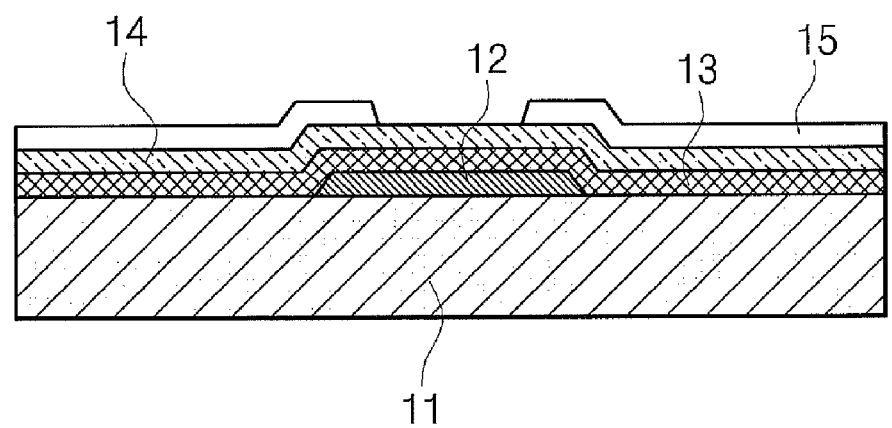

Thereafter, as shown in FIG. 3, an oxidation barrier layer 15 is formed on the transparent metal oxide layer 14.

The oxidation barrier layer is not formed over the entire surface of the transparent metal oxide layer 14 but is formed in such a manner that a portion of the transparent metal oxide layer 14 can be exposed. That is, the oxidation barrier layer 15 is formed in such a manner that a portion of the transparent metal oxide layer positioned over the gate electrode 12 is exposed.

The open portion of the oxidation barrier layer preferably has the same length as a channel of the final thin film transistor. The reason why the open portion of the oxidation barrier layer, by which a portion of the transparent metal oxide layer 14 is exposed, has the same length as a channel of the final thin film transistor, is that only the channel must be formed of a semiconductor. The oxidation barrier layer preferably has a pattern size larger than the width of the transparent metal oxide layer.

Then, only the exposed portion of the transparent metal oxide layer 14 is locally oxidized to be converted into be a semiconductor layer, as shown in FIG. 4.

The local oxidation serves to oxidize an excess of a metallic material contained in the exposed portion of the transparent metal oxide layer 14, thus allowing the exposed portion to have semiconducting properties.

The local oxidation is preferably performed by a technique selected from ion implantation, chemical oxidation, and anodization. The selected technique allows the exposed portion of the transparent metal oxide layer to have semiconducting properties, so that the exposed portion can be used as a channel region of the final thin film transistor.

The exposed portion of the transparent metal oxide layer 14, which is converted into a semiconductor layer by the local oxidation, can be used as a channel region 16, and the unexposed portions of the transparent metal oxide layer, which are unoxidized due to the presence of the oxidation barrier layer 15, can be used as source and drain electrodes.

Thereafter, in accordance with a general method for fabricating thin film transistors, at least one element selected from a passivation layer, a pixel electrode and other elements may be formed on the semiconductor channel region 16 and the source/drain electrodes 14 to complete the fabrication of the final thin film transistor.

As apparent from the foregoing constitutions and preferred embodiments, the present invention provides a method for fabricating a thin film transistor using local oxidation and a transparent thin film transistor. According to the method and the transparent thin film transistor of the present invention, a portion of a transparent metal oxide layer formed on a gate insulating layer is locally oxidized to be converted into a semiconductor layer so that the oxidized portion of the transparent metal oxide layer can be used as a channel region and the unoxidized portions of the transparent metal oxide layer can be used as source and drain electrodes. Therefore, the formation procedure of a channel region and source/drain electrodes is simplified, and as a result, the fabrication costs of the transparent thin film transistor are advantageously reduced.

What is claimed is:

1. A method for fabricating a thin film transistor, the method comprising the steps of:
    forming a gate electrode on a substrate and forming a gate insulating layer thereon;
    forming a transparent metal oxide layer on the gate insulating layer;
    forming an oxidation barrier layer on the transparent metal oxide layer in such a manner that a portion of the transparent metal oxide layer positioned over the gate electrode is exposed; and
    locally oxidizing only the exposed portion of the transparent metal oxide layer to convert the exposed portion into a semiconductor layer.

2. The method according to claim 1, wherein the transparent metal oxide layer is a metal-rich conductive oxide layer.

3. The method according to claim 1, wherein the local oxidation is performed by a technique selected from ion implantation, chemical oxidation, and anodization.

4. The method according to claim 1, wherein the transparent metal oxide layer has a thickness of 1 nm to 1,000 nm.

5. The method according to claim 1, wherein the open portion of the oxidation barrier layer has the same length as a channel of a thin film transistor.

6. The method according to claim 1, wherein the oxidation barrier layer has a pattern size larger than the width of the transparent metal oxide layer.

7. A transparent thin film transistor fabricated by the method according to any one of claims 1 to 6.

* * * * *